(12) United States Patent
Hasegawa et al.

(10) Patent No.: US 9,624,369 B2
(45) Date of Patent: Apr. 18, 2017

(54) LIQUID RESIN COMPOSITION, CURED PRODUCT, WIRING STRUCTURE, AND PACKAGE USING WIRING STRUCTURE

(71) Applicant: Panasonic Intellectual Property Management Co., Ltd., Osaka (JP)

(72) Inventors: Takashi Hasegawa, Mie (JP); Takanori Konishi, Mie (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/120,768

(22) PCT Filed: Mar. 24, 2015

(86) PCT No.: PCT/JP2015/001658
§ 371 (c)(1),
(2) Date: Aug. 23, 2016

(87) PCT Pub. No.: WO2015/146149
PCT Pub. Date: Oct. 1, 2015

(65) Prior Publication Data
US 2016/0362546 A1  Dec. 15, 2016

(30) Foreign Application Priority Data
Mar. 25, 2014 (JP) .................... 2014-061327

(51) Int. Cl.
*H01L 23/28* (2006.01)
*H01L 23/29* (2006.01)
(Continued)

(52) U.S. Cl.
CPC ............ *C08L 63/00* (2013.01); *C08G 59/621* (2013.01); *H01L 23/49894* (2013.01)

(58) Field of Classification Search
CPC ...... C08G 18/58; C08G 59/62; C08G 59/621; C08L 63/00; H01L 23/295;
(Continued)

(56) References Cited

U.S. PATENT DOCUMENTS

2009/0166897 A1* 7/2009 Katsurayama ......... C08G 59/18
257/793
2009/0261484 A1* 10/2009 Kanagawa ........... C08K 3/0033
257/793

(Continued)

FOREIGN PATENT DOCUMENTS

| JP | 1-271422 | 10/1989 |
| JP | 2003-292572 | 10/2003 |

(Continued)

OTHER PUBLICATIONS

International Search Report of PCT application No. PCT/JP2015/001658 dated Jun. 16, 2015.

*Primary Examiner* — Jasmine Clark
(74) *Attorney, Agent, or Firm* — McDermott Will & Emery LLP

(57) ABSTRACT

A liquid resin composition includes a liquid epoxy resin, a liquid curing agent, a curing accelerator and a ceramic filler. The liquid epoxy resin contains a first epoxy resin having a polyalkylene glycol framework. The liquid curing agent has a plurality of phenolic hydroxy groups per molecule. A content of the first epoxy resin in the liquid epoxy resin is in a range from 30% to 70% by mass, inclusive. The ceramic filler has an average particle diameter of 50 μm or less, and a content of the ceramic filler in the liquid resin composition is in a range from 50% to 90% by mass, inclusive. The liquid resin composition has a viscosity of 100 Pa·s or less at 25° C.

11 Claims, 15 Drawing Sheets

(51) Int. Cl.
*C08L 63/00* (2006.01)
*C08G 59/62* (2006.01)
*H01L 23/498* (2006.01)

(58) Field of Classification Search
CPC ..... H01L 2924/0002; H01L 2924/3512; H01L 2924/0665; H01L 2924/066; H01L 23/293; H01L 2224/29099
See application file for complete search history.

(56) References Cited

U.S. PATENT DOCUMENTS

| | | | |
|---|---|---|---|
| 2012/0025132 A1 | 2/2012 | Asahi et al. | |
| 2013/0062790 A1* | 3/2013 | Iwashige | C09D 163/00 257/793 |
| 2013/0065986 A1* | 3/2013 | Sato | C08G 59/226 523/427 |

FOREIGN PATENT DOCUMENTS

| | | |
|---|---|---|
| JP | 2004-027005 | 1/2004 |
| JP | 2006-176678 | 7/2006 |
| JP | 2009-097013 | 5/2009 |
| JP | 2010-229266 | 10/2010 |
| JP | 2011-079904 | 4/2011 |
| JP | 2014-095063 | 5/2014 |
| WO | 2010/098066 | 9/2010 |

* cited by examiner

LIQUID RESIN COMPOSITION, CURED PRODUCT, WIRING STRUCTURE, AND PACKAGE USING WIRING STRUCTURE

TECHNICAL FIELD

The present invention relates to a wiring structure which is used for mounting various electronic devices such as mobile terminal devices; a package having the wiring structure and a semiconductor or the like mounted to the wiring structure; and a liquid resin composition and a cured product of the liquid resin composition each used for the wiring structure and the package.

BACKGROUND ART

FIG. 18 is a cross-sectional view of conventional circuit board 10. Wiring 20 formed from a lead frame is embedded in resin 30 to form circuit board 10. If required, metallic plate 40 for heat dissipation is attached onto a rear surface of circuit board 10 (see, for example, PTL 1).

In circuit board 10, as a metallic material constituting wiring 20, tough-pitch copper or a wiring material for use in flexible wiring boards is used. The tough-pitch copper and a wiring material have excellent flexibility. However, the flexibility of circuit board 10 is insufficient yet.

When metallic plate 40 is removed from circuit board 10, circuit board 10 can be thinner. However, in circuit board 10 from which metal 40 is removed, when a filling rate of a ceramic filler contained in resin 30 is increased for the purpose of bringing a coefficient of thermal expansion of resin 30 close to that of a semiconductor, the flexibility of circuit board 10 decreases. As a result, circuit board 10 may be broken easily upon bending.

On the other hand, a wafer-level chip size package or the like has been demanded in the market. In a cured product of a liquid resin composition, a circuit board and the like which are used in the package, a low coefficient of thermal expansion, a certain level or higher of stiffness and a certain level or higher of flexibility of a thinned product of the cured product, the circuit board and the like are important. As the package for use in the above-mentioned applications, a wafer-level chip size package has been proposed (see, for example, PTL 2).

For the above-mentioned purposes, a liquid sealing resin composition containing a silicone-modified liquid epoxy resin, a liquid polyphenol, a curing accelerator and an inorganic filler has been proposed (see, for example, PTL 3).

CITATION LIST

Patent Literatures

PTL 1: International Publication No. 2010/098066
PTL 2: Unexamined Japanese Patent Publication No. 2009-97013
PTL 3: Unexamined Japanese Patent Publication No. 2003-292572

SUMMARY OF THE INVENTION

The present invention provides a liquid resin composition having excellent properties including low stress and high adhesion properties. A cured product of the liquid resin composition has both excellent flexibility and a certain level or higher of hardness (stiffness) required upon mounting. Therefore, the liquid resin composition can be used for a wafer-level chip size package and the like.

A liquid resin composition according to an aspect of the present invention contains a liquid epoxy resin, a liquid curing agent, a curing accelerator and a ceramic filler. The liquid epoxy resin includes a first epoxy resin having a polyalkylene glycol framework. The liquid curing agent has a plurality of phenolic hydroxy groups per molecule. A content of the first epoxy resin in the liquid epoxy resin is in a range from 30% to 70% by mass, inclusive. The ceramic filler has an average particle diameter of 50 μm or less, and a content of the ceramic filler in the liquid resin composition is in a range from 50% to 90% by mass, inclusive. The liquid resin composition has a viscosity of 100 Pa·s or less at 25° C. The liquid resin composition has an excellent property of being filled into various minute parts because of its low viscosity as mentioned above.

A cured product according to another aspect of the present invention is a cured product of the above-mentioned liquid resin composition, and has a glass transition temperature in a range from 50° C. to 120° C., inclusive and an elastic modulus of 20 GPa or less at 25° C. The cured product has flexibility, and therefore a wiring structure and a wiring board that is one type of the wiring structure each involving the cured product have high reliability.

A cured product according to yet another aspect of the present invention is a cured product of the above-mentioned liquid resin composition, and has a glass transition temperature in a range from 50° C. to 120° C., inclusive and a Shore D hardness of 40 or more at 25° C. The cured product has stiffness at a level necessary for the mounting of a semiconductor, and therefore a wire structure or a wiring board each involving the cured product have high reliability.

A wiring structure according to still another aspect of the present invention has the cured product of the above-mentioned liquid resin composition and a metallic wiring. The metallic wiring partially adheres to the cured product or is partially embedded in the cured product. The cured product has a glass transition temperature in a range from 50° C. to 120° C., inclusive and an elastic modulus of 20 GPa or less at 25° C. Even when the coreless interposer is made thinner to 0.2 mm or less, still to 0.1 mm or less, or further still to 50 μm or less, the coreless interposer is hardly broken and is therefore suitable for semiconductor mounting purposes.

A package according to further still another aspect of the present invention has a wiring structure and a semiconductor mounted to the wiring structure. The wiring structure includes the cured product of the above-mentioned liquid resin composition and a metallic wiring. The metallic wiring partially adheres to the cured product or is partially embedded in the cured product. The cured product has a glass transition temperature in a range from 50° C. to 120° C., inclusive and an elastic modulus of 20 GPa or less at 25° C. Even when the wiring structure is made thinner to 2.0 mm or less, still to 1.0 mm or less or further still to 0.5 mm or less, the wiring structure is hardly broken.

The liquid resin composition according to the present invention has a low viscosity, and therefore can spread throughout a wiring part that is composed of a fine lead frame or the like and can exert excellent adhesion properties. A cured product, a wiring structure and a package each produced using the liquid resin composition enables various mobile terminal devices to have enhanced performance and improved reliability.

Furthermore, the cured product and the wiring structure each produced using the liquid resin composition according to the present invention have excellent flexibility. The flexibility at this level cannot be achieved in conventional glass epoxy boards and build-up boards which have been used for mounting semiconductor chips, or interposer manufactured employing the conventional techniques. Therefore, a wiring structure having flexibility can be produced using the cured product formed from the liquid resin composition according to the present invention. The use of the wiring structure enables the production of an interposer having flexibility at such a level that cannot be achieved by conventional glass epoxy printed circuit boards or build-up boards.

Furthermore, a coreless interposer can be provided by using the wiring structure formed from the liquid resin composition according to the present invention as an interposer for semiconductor chip mounting use. The wording "coreless interposer" as used herein means that a conventional glass epoxy board or a build-up board which has been used for mounting semiconductor chips, or a core substrate manufactured employing these techniques can be omitted.

Heretofore, flexible wiring boards having polyimide films and copper foils are put on the market as flexible substrates. In the conventional flexible substrates as mentioned above, warpage upon mounting hardly occurs compared to glass epoxy boards and the like. However, the conventional flexible substrates do not have stiffness or rigidity (resistance to bending), and therefore are less likely to be used as interposers by themselves without using any stiff support substrate.

DESCRIPTION OF EMBODIMENT

Prior to describing the exemplary embodiments of the present invention, problems in conventional sealing resin compositions will be described in brief. A conventional sealing resin composition disclosed in PTL 3 is excellent in low stress and adhesion properties. However, the silicone-modified epoxy resin has poor reactivity, and therefore the resin exudes during curing, which defaces a connection terminal in a semiconductor device with the resin.

Hereinafter, the liquid resin composition according to the exemplary embodiments of the present invention will be described. The liquid resin composition is an uncured liquid resin composition containing at least a liquid epoxy resin, a liquid curing agent, a curing accelerator and a ceramic filler. A material that has a liquid form at room temperature (25° C.) can be used as each of the epoxy resin and the cured product to reduce a viscosity of the liquid resin composition at room temperature (25° C.).

Specifically, the liquid epoxy resin includes a first epoxy resin having a polyalkylene glycol framework. The liquid curing agent has a plurality of phenolic hydroxy groups per molecule. A content of the first epoxy resin in the liquid epoxy resin is in a range from 30% to 70% by mass, inclusive. The ceramic filler has an average particle diameter of 50 μm or less, and a content of the ceramic filler in the liquid resin composition is in a range from 50% to 90% by mass, inclusive. The liquid resin composition has a viscosity of 100 Pa·s or less at 25° C. Due to this viscosity of the liquid resin composition, the liquid resin composition can be spread throughout every part such as metallic plates, metallic wiring and the like and adhesiveness of the liquid resin composition to the parts improves.

Next, optimization of the ceramic filler contained in the liquid resin composition will be described with reference to FIGS. 1 to 4. In FIGS. 1 to 4, line 110 is one example of an asymptotic line formed on the basis of actually measured values shown by filled circles.

Figure 1:
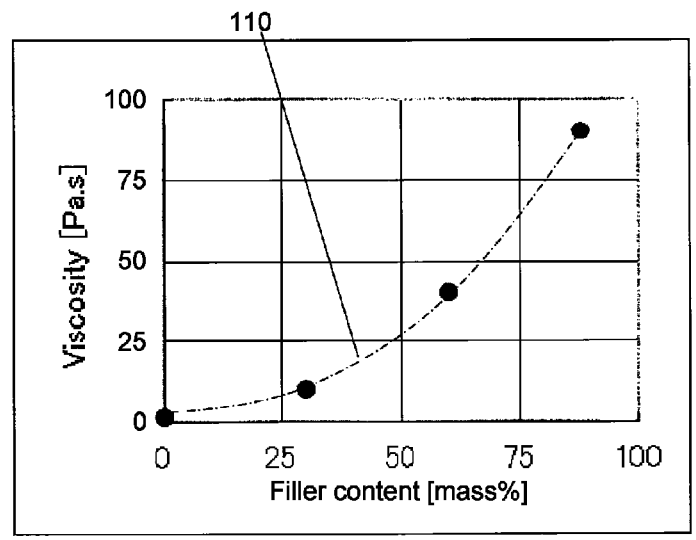
FIG. 1 illustrates one example of a relationship between a filling rate of a ceramic filler contained in a liquid resin composition according to an exemplary embodiment of the present invention and a viscosity of the liquid resin composition.

FIG. 1 illustrates one example of a relationship between a filling rate of a ceramic filler contained in a liquid resin composition and a viscosity of the liquid resin composition. X-axis represents a content (% by mass) of the ceramic filler contained in the liquid resin composition, and Y-axis represents the viscosity (Pa·s) of the liquid resin composition. As a matter of course, conditions other than the content of the ceramic filler are constant.

As shown in FIG. 1, it is found that the viscosity of the liquid resin composition increases with the increase in the content of the ceramic filler. The viscosity of the liquid resin composition is preferably as low as 100 Pa·s or less, more preferably 50 Pa·s or less, still more preferably 20 Pa·s or less, particularly preferably 10 Pa·s or less, at 25° C. The lower the viscosity is, the easier the liquid resin composition can be filled into a metallic wiring or the like. If the viscosity is less than 1 Pa·s, the filler added to the liquid resin composition may precipitate easily and it may be difficult to add the filler at a content of 50% by mass or more.

In order to adjust the viscosity at 25° C. to 100 Pa·s or less, an epoxy-type diluent or an organic solvent may be added to the liquid resin composition. As the organic solvent, glycol ethers, alcohols, ketones or the like can be used. As the glycol ethers, diethyl diglycol, dibutyl diglycol, dimethyl propylene diglycol or the like can be used. The viscosity of the liquid resin composition at 25° C. can be decreased to about 1 to 10 Pa·s by adding the glycol ether in an amount of 3 to 8% by mass to the liquid resin composition. These organic solvents and the epoxy-type diluents may be used singly, or two or more of them may be used in combination.

An amount of the epoxy-type diluent or the organic solvent to be added to the liquid resin composition is preferably 10% by mass or less, more preferably 5% by mass or less. These components evaporate during the curing of the liquid resin composition. Therefore, if the amount of the component to be added is more than 10% by mass, voids may be formed in a cured product of the liquid resin composition, and reliability may be adversely affected.

For the measurement of the viscosity, "method for measuring viscosity of liquid" in accordance with JIS Z 8803 or a method in accordance with JIS K7117-1 or K7117-2 is employed. Practically, the viscosity can be measured using a commercially available single cylinder type rotary viscometer or cone-plate rotational viscometer which is called a type-B or type-E viscometer within a low shear rate range that can be measured with the above-mentioned viscometer.

The average particle diameter of the ceramic filler is preferably 50 μm or less, more preferably 30 μm or less, still more preferably 20 μm or less. If the average particle diameter of the ceramic filler is more than 50 μm, the volume of voids (may also be called "void spaces") in the cured product produced by curing the liquid resin composition may be increased, and insulation reliability may be adversely affected. In addition, fluidability of the liquid resin composition is deteriorated and, therefore, the filling property of the liquid resin composition into minute parts formed between wirings is also deteriorated.

On the other hand, the average particle diameter of the ceramic filler is preferably 0.1 μm or more. If the average particle diameter is less than 0.1 μm, a BET value becomes too large and the viscosity of the liquid resin composition becomes 100 Pa·s or more at 25° C.

Ceramic filler particles having larger sizes contained in the ceramic filler can be removed in advance by using a classified ceramic filler. When a classified ceramic filler is used, a top cut particle diameter can be adjusted to 5 m or less, more preferably 75 μm or less, to remove ceramic filler particles having larger sizes in advance.

For example, it is preferable that the average particle diameter of the ceramic filler is adjusted to 50 μm or less and the top cut particle diameter of the ceramic filler is adjusted to 75 μm or less.

It is more preferable that the average particle diameter of the ceramic filler is adjusted to 50 μm or less and the top cut particle diameter of the ceramic filler is adjusted to 54 μm or less. When the average particle diameter of the ceramic filler is reduced and the top cut particle diameter is reduced, the filling property of the liquid resin composition into minute parts is improved.

Figure 2:
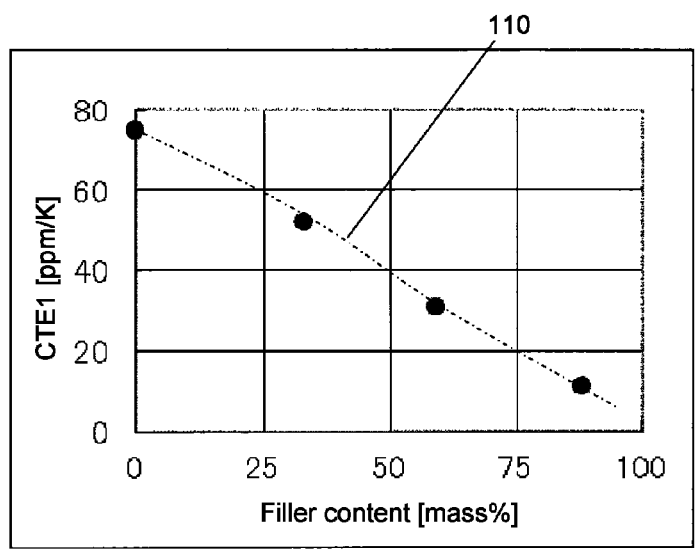
FIG. 2 illustrates one example of a relationship between a filling rate of a ceramic filler contained in a cured product of the liquid resin composition according to the exemplary embodiment of the present invention and a coefficient of thermal expansion of the cured product.

Next, the optimization of a coefficient of thermal expansion (CTE1) will be described with reference to FIG. 2. FIG. 2 illustrates one example of a relationship between the filling rate (% by mass) of the ceramic filler contained in the cured product of the liquid resin composition and a coefficient of thermal expansion (ppm/K) of the cured product. X-axis represents a content (% by mass) of the ceramic filler contained in the cured product of the liquid resin composition, and Y-axis represents the coefficient of thermal expansion of the cured product. As shown in FIG. 2, the coefficient of thermal expansion of the cured product is reduced with the increase in the content of the ceramic filler.

It is preferable that the coefficient of thermal expansion of the cured product is close to a coefficient of thermal expansion of a semiconductor chip (particularly a silicon wafer). In general, a coefficient of thermal expansion of a cured product of an epoxy resin is 65 ppm/K to 100 ppm/K which is several tens of times a coefficient of thermal expansion of a semiconductor chip. The coefficient of thermal expansion of the cured product can be adjusted to 30 ppm/K or less, more preferably 15 ppm/K, by increasing the amount of the ceramic filler to be added to the liquid resin composition. As the ceramic filler, alumina, aluminum nitride, silicon nitride, silica ($SiO_2$) and the like may be used singly or two or more of them may be used in a blended form. The coefficient of thermal expansion of alumina is about 7.2 ppm/K, the coefficient of thermal expansion of aluminum nitride is about 4.6 ppm/K, the coefficient of thermal expansion of silicon nitride is about 2.6 ppm/K, and the coefficient of thermal expansion of silica is about 0.5 to 0.6 ppm/K. The measurement of a coefficient of thermal expansion can be carried out by reference to JIS R1616-1994 or the like.

The content (% by mass) of the ceramic filler in the liquid resin composition is set in a range from 50% to 90% by mass, inclusive. If the content of the ceramic filler is less than 50%, the coefficient of thermal expansion of the cured product is increased as illustrated in FIG. 2 while the viscosity of the liquid resin composition is reduced as illustrated in FIG. 1. As a result, the liquid resin composition may not be adapted to the mounting of a semiconductor. If the content of the ceramic filler is more than 90% by mass, on the other hand, the viscosity of the liquid resin composition at 25° C. becomes as high as 100 Pa·s or more as illustrated in FIG. 1, resulted in the deterioration in the filling property of the liquid resin composition into minute parts between wirings.

Figure 3:
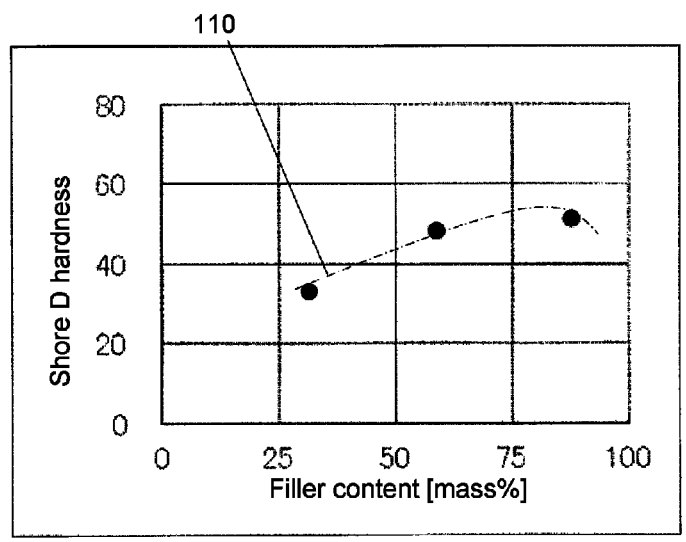
FIG. 3 illustrates one example of a relationship between the filling rate of the ceramic filler contained in the cured product of the liquid resin composition according to the exemplary embodiment of the present invention and a Shore D hardness of the cured product.

FIG. 3 illustrates one example of a relationship between the filling rate (% by mass) of the ceramic filler contained in the cured product of the liquid resin composition and a Shore D hardness of the cured product. X-axis represents a content (% by mass) of the ceramic filler contained in the cured product of the liquid resin composition, and Y-axis represents the Shore D hardness of the cured product. As shown in FIG. 3, the Shore D hardness of the cured product increases with the increase in the content of the ceramic filler.

It is preferable that the liquid resin composition after curing has a Shore D hardness of 40 or more. If the Shore D hardness after curing is less than 40, the stiffness of the cured product for use as a wiring structure is deteriorated, and workability and mounting reliability during mounting may be adversely affected. It is desirable that the Shore D hardness is 60 or less, more preferably 55 or less. If the Shore D hardness is more than 60, warpage, cracking or the like may occur in the cured product of the liquid resin composition.

The Shore D hardness can be measured using a Shore D-type measurement device as described in JIS K 7215 or ISO 868. Also from the viewpoint of Shore D hardness, the filling rate of the ceramic filler contained in the cured product of the liquid resin composition is preferably in a range from 50% to 90% by mass, inclusive, with respect to the whole amount of the liquid resin composition. If the content of the ceramic filler is less than 50% by mass, the Shore D hardness becomes less than 40 and the stiffness becomes insufficient when the liquid resin composition is used in a wiring structure. If the content of the ceramic filler is more than 90% by mass, the Shore D hardness becomes high, and it may be resulted in the occurrence of a problem with flexibility. With respect to a Shore hardness, a measurement value may represent various types of hardness depending on the types of the measurement devices, e.g., a type-A measurement device and a type-D measurement device. In this exemplary embodiment of the present invention, a Shore D hardness is employed.

Figure 4:
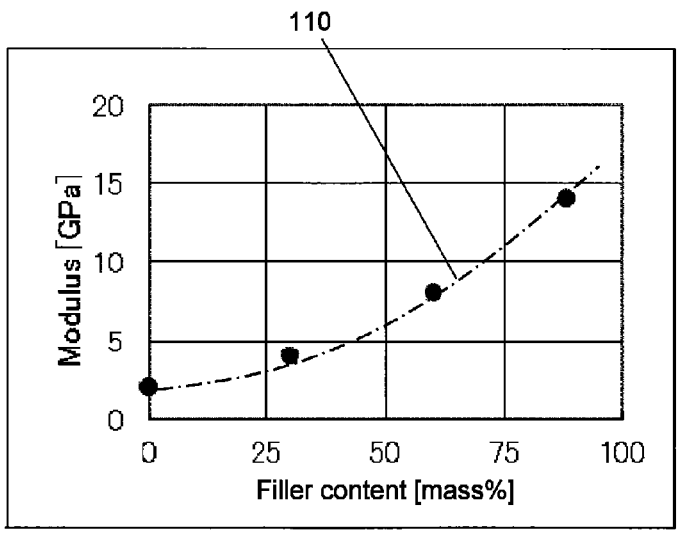
FIG. 4 illustrates one example of a relationship between the filling rate of the ceramic filler contained in the cured product of the liquid resin composition according to the exemplary embodiment of the present invention and an elastic modulus of the cured product.

FIG. 4 illustrates one example of a relationship between the filling rate (% by mass) of the ceramic filler contained in the cured product of the liquid resin composition and an elastic modulus of the cured product. X-axis represents the content (% by mass) of the ceramic filler contained in the cured product of the liquid resin composition, and Y-axis represents the elastic modulus (unit: GPa) of the cured product at 25° C. As shown in FIG. 4, the elastic modulus of the cured product increases with the increase in the content of the ceramic filler.

The cured product of the liquid resin composition has an elastic modulus of preferably 0.01 GPa or more, more preferably 0.1 GPa or more. If the elastic modulus of the cured product is less than 0.01 GPa, the stiffness required for use as a wiring structure or a wiring substrate may not be satisfied. The cured product of the liquid resin composition preferably has an elastic modulus of 20 GPa or less, more preferably 15 GPa or less. If the elastic modulus of the cured product is more than 20 GPa, the flexibility of the cured product is deteriorated, and cracking or the like may be generated in the cured product when the cured product is bent.

The elastic modulus can be measured with reference to JIS K 6911, JIS K 7161, K7162.7113 or the like. When the liquid resin composition or the cured product of the liquid resin composition is used in a wiring structure, a wiring substrate, an interposer or the like for semiconductor mounting use, it may be advantageous to measure the elastic modulus as a bending elastic modulus rather than a tensile property. A bending elastic modulus is preferably measured by a ternary bending test or a three-point bending test. In a ternary bending test, a center part of a test specimen is supported and a load is applied to both edges of the test specimen. In a three-point bending test, both edges of a test specimen are supported and a load is applied concentrically to a center part of the test specimen.

Next, a content of an epoxy resin having a polyalkylene glycol framework in the liquid epoxy resin will be described with reference to FIGS. 5 to 8. In FIGS. 5 to 8, although the title of the horizontal axis is written as "Polyalkylene glycol content", the horizontal axis represents a content (% by mass) of the epoxy resin having a polyalkylene glycol framework in the liquid epoxy resin.

Figure 5:
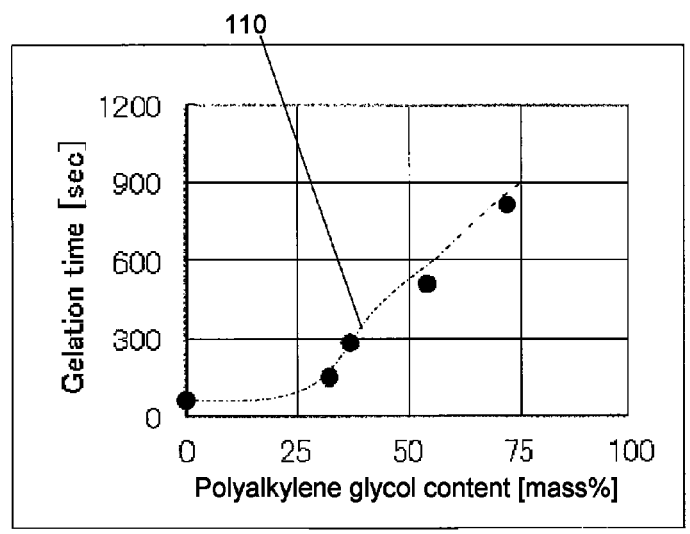
FIG. 5 illustrates one example of a relationship between a content of a first epoxy resin having a polyalkylene glycol framework in the liquid resin composition according to the exemplary embodiment of the present invention and a gelation time of the cured product of the liquid resin composition.

FIG. 5 illustrates one example of a relationship between a content (% by mass) of an epoxy resin having a polyalkylene glycol framework in the liquid epoxy resin and a gelation time (sec) of a cured product of the liquid epoxy resin. As shown in FIG. 5, when the content of the epoxy resin having a polyalkylene glycol framework is 25% by mass or more, more preferably 30% by mass or more, the gelation time becomes 100 seconds or longer, more preferably 200 seconds or longer and therefore the time for gelation of the liquid epoxy resin is drastically prolonged.

When the gelation time is prolonged, a pot life of the liquid resin composition is also prolonged. When the content of the epoxy resin having a polyalkylene glycol framework is more than 75 wt %, the gelation time can be prolonged to 1000 seconds or longer. In this case, however, if the content of the epoxy resin having a polyalkylene glycol framework is more than 75% by mass, a problem with a handling property may occur. The gelation time is preferably measured with reference to the gelation time measurement described in JIS K 7071. As mentioned above, the content of the epoxy resin having a polyalkylene glycol framework is set in a range from 25% to 75% by mass, inclusive.

Figure 6:
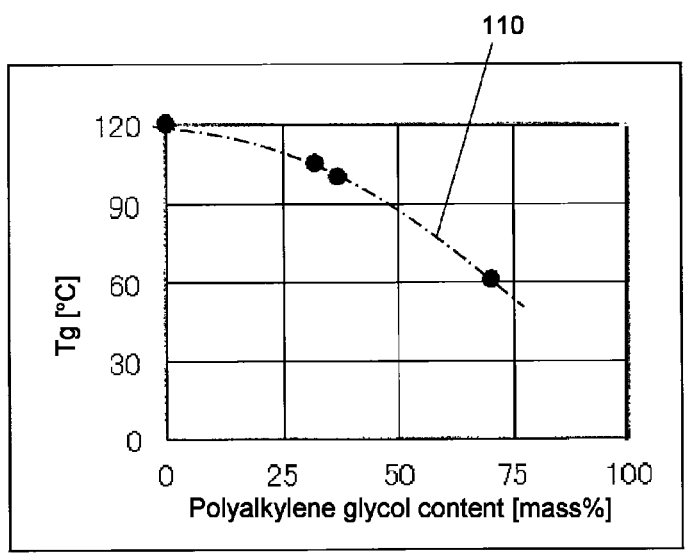
FIG. 6 illustrates one example of a relationship between the content of the first epoxy resin having a polyalkylene glycol framework in the liquid resin composition according to the exemplary embodiment of the present invention and a glass transition temperature of the cured product of the liquid resin composition.

FIG. 6 illustrates one example of a relationship between the content (% by mass) of an epoxy resin having a polyalkylene glycol framework in the liquid epoxy resin and a glass transition temperature (Tg) of the cured product of the liquid resin composition. As shown in FIG. 6, if the content of the epoxy resin having a polyalkylene glycol framework is less than 25% by mass, Tg is high. As a result, the flexibility of the cured product is deteriorated, and an internal stress may be generated in the inside of the cured product. If the content of the epoxy resin having a polyalkylene glycol framework is more than 75% by mass, Tg is too low. As a result, a problem with a handling property or a dimensional stability may occur.

Tg is preferably in a range from 50° C. to 120° C., inclusive. If Tg is lower than 50° C., the Shore D hardness is reduced to less than 40 and stiffness and mountability may be adversely affected. If Tg is higher than 120° C., a problem may occur in a bending test or the like. As mentioned above, from the viewpoint of Tg, the content of the epoxy resin having a polyalkylene glycol framework is preferably in a range from 25% to 75% by mass, inclusive.

Figure 7:
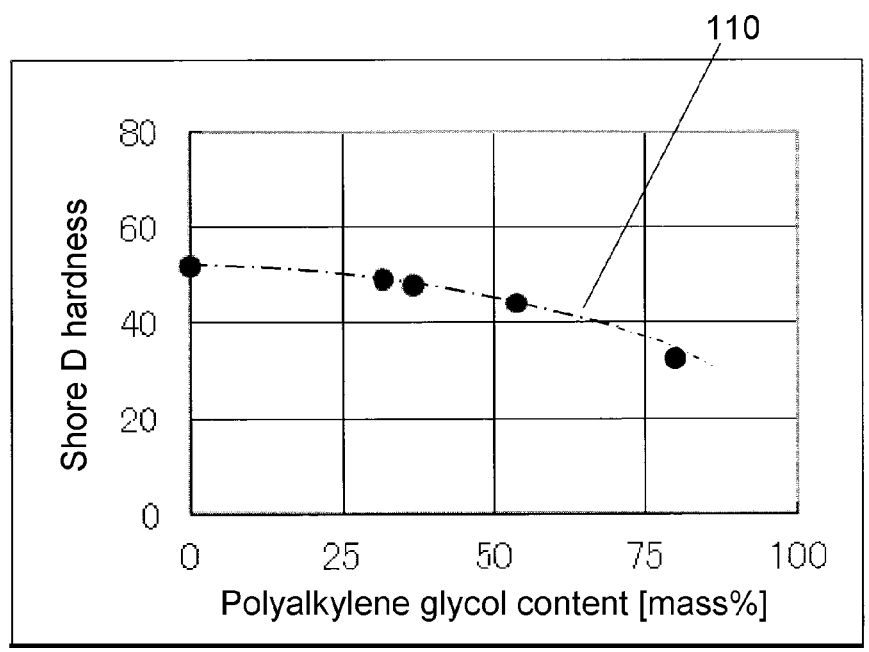
FIG. 7 illustrates one example of a relationship between the content of the first epoxy resin having a polyalkylene glycol framework in the liquid resin composition according to the exemplary embodiment of the present invention and a Shore D hardness of the cured product of the liquid resin composition.

FIG. 7 illustrates one example of a relationship between the content (% by mass) of an epoxy resin having a polyalkylene glycol framework in the liquid epoxy resin and a Shore D hardness of the cured product of the liquid resin composition. As shown in FIG. 7, the content of the epoxy resin having a polyalkylene glycol framework is preferably 75% by mass or less. If the content exceeds 75% by mass, the Shore D hardness becomes too low and, therefore, a problem with a handling property and a dimensional stability may occur.

Figure 8:
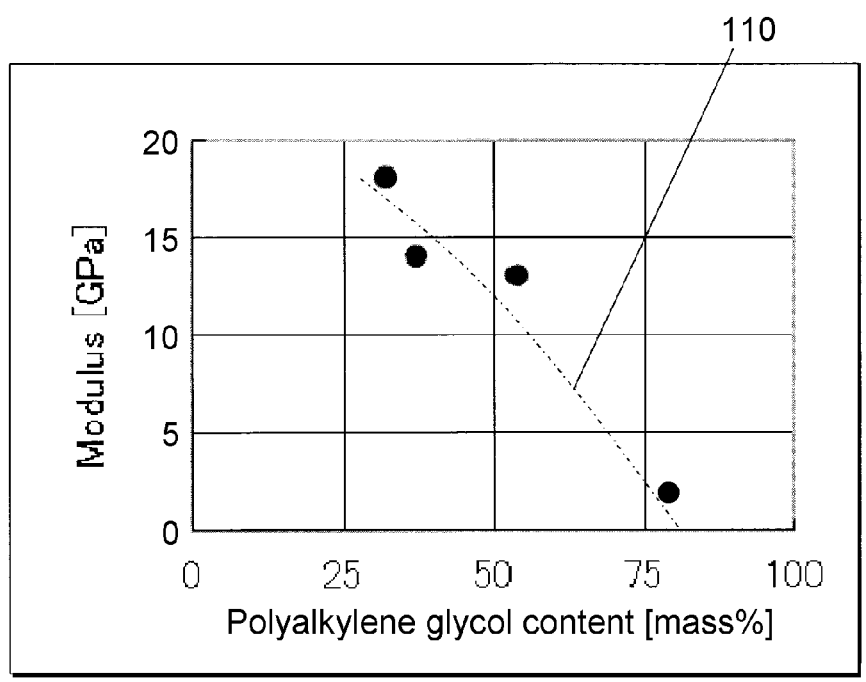
FIG. 8 illustrates one example of a relationship between the content of the first epoxy resin having a polyalkylene glycol framework in the liquid resin composition according to the exemplary embodiment of the present invention and an elastic modulus of the cured product of the liquid resin composition.

FIG. 8 illustrates one example of a relationship between the content (% by mass) of an epoxy resin having a polyalkylene glycol framework in the liquid epoxy resin and an elastic modulus (modulus). As shown in FIG. 8, when the content of the epoxy resin having a polyalkylene glycol framework is 25% by mass or more, the elastic modulus is reduced to a value suitable for a wiring structure or a wiring substrate. If the content is more than 75% by mass, the elastic modulus becomes too low and, therefore, a problem with a handling property and a dimensional stability may occur. As mentioned above, from the viewpoint of the elastic modulus, the content of the epoxy resin having a polyalkylene glycol framework is preferably in a range from 25% to 75% by mass, inclusive.

As the liquid epoxy resin, it is preferable to use a combination of a liquid bisphenol F-type epoxy resin and a liquid epoxy resin having a polyalkylene glycol framework. When a bisphenol F-type epoxy resin and an epoxy resin having a polyalkylene glycol framework are used in combination, a cured product can be imparted with heat resistance.

In addition, a liquid phenolic resin is used as a liquid curing agent in the above-mentioned liquid epoxy resin (i.e., a combination of a bisphenol F-type epoxy resin and an epoxy resin having a polyalkylene glycol framework).

When the liquid epoxy resin and the liquid curing agent are used in combination as mentioned above, the viscosity of the whole resin is reduced. Due to the reduction in the viscosity of the whole resin, it becomes possible to spread the liquid resin composition thinly throughout minute parts formed between metallic wirings and the like.

The liquid phenolic resin contains a compound having a plurality of phenolic hydroxy groups per molecule (a phenol-type curing agent). When the above-mentioned liquid epoxy resin is combined with the phenol-type curing agent, Tg decreases and hydrolysis is less likely to occur, resulted in the improvement in moisture proof reliability. The phenol-type curing agent is hardly evaporated, and therefore hardly causes a problem that a curing agent component is volatilized to cause insufficient curing.

Furthermore, it is preferable to add a curing accelerator and/or an elasticity-reducing material to the liquid resin composition. Particularly, the warpage of the cured product can be prevented by using an elasticity-reducing material. As the curing accelerator, imidazole can be used. As the elasticity-reducing material, a material containing an elastomer component or a rubber component, e.g., a silicone resin, can be used.

The amount of warpage can be reduced by any one of two ways: in one way, a difference between a coefficient of linear expansion of an object onto which the liquid resin composition is to be applied and that of the resin is minimized, and in the other way, a stress expressed by a product of the coefficient of linear expansion and the elastic modulus is minimized by reducing an elastic modulus of the resin. Since the resin cured product is in a rubbery zone and therefore has a low elastic modulus at a temperature higher than Tg, a technique in which Tg is brought close to room temperature is extremely effective for reducing an elastic modulus (see, for example, Unexamined Japanese Patent Publication No. 2006-232950). According to this technique, however, the decrease in an elastic modulus may significantly occur. For example, the elastic modulus may decrease by the order of two digits or more below or above Tg. Therefore, it may be difficult to control the elastic modulus.

In order to address this problem, in the present exemplary embodiment, the elastic modulus of the cured product at room temperature (25° C.) is adjusted to 20 GPa or less and Tg is adjusted in arrange from 50° C. to 120° C., inclusive. By controlling the elastic modulus and Tg to the above-mentioned values, it becomes possible to prevent distortion, e.g., warpage, of the cured product when the cured product is used as an insulating resin to be used in a wiring structure. As a result, the reliability of the wiring structure (or wiring board) as well as the attachability and/or mountability of a semiconductor or the like in the wiring structure (or circuit board) are improved by using the liquid resin composition according to the present exemplary embodiment.

It is preferable that the liquid epoxy resin has a long-chain structure and the liquid epoxy resin, particularly the epoxy resin having a polyalkylene glycol framework, has a molecular weight of 500 to 1000, inclusive. If the molecular weight is less than 500, the liquid epoxy resin may be difficult to handle. It is also preferable that the liquid curing agent has a plurality of phenolic hydroxy groups per molecule. This is because a liquid curing agent having several phenolic hydroxy groups per molecule has a smaller molecular weight compared with common solid phenolic resins (e.g., a phenol novolac resin), so that Tg of the liquid resin composition after curing is lowered. If the molecular weight is more than 1000, on the contrary, the composition may not have a liquid form and therefore may not exert fluidability.

It is preferable that the content of the epoxy resin having a polyalkylene glycol framework in the liquid epoxy resin is in a range from 25% to 75% by mass, inclusive, as mentioned above. The epoxy resin having a polyalkylene glycol framework has a larger molecular weight compared with common liquid epoxy resins and therefore has a long-chain structure. As a result, Tg of the cured product is lowered. If the content of the epoxy resin having a polyalkylene glycol framework in the liquid resin is more than 75% by mass, reactivity may be adversely affected, and it may be resulted in the production of a non-uniform cured product. If the content is less than 25% by mass, the effect of lowering Tg may not be achieved easily. As such the epoxy resin, poly(2)hydroxyalkane (C3) glycidyl ether (CAS No. 9072-62-02) and others are commercially available.

It is desirable that the epoxy resin having a polyalkylene glycol framework has an epoxy equivalent of 1000 or less, more preferably 700 or less, still more preferably 500 or less. If the epoxy equivalent is more than 1000 (in other words, a concentration of functional groups is small), the probability of occurrence of the reaction between the epoxy resin and the curing agent may be decreased and therefore the curing reaction may be adversely affected.

It is also desirable that the epoxy resin having a polyalkylene glycol framework has a viscosity of 1000 mPa·s or less. If the viscosity is more than 1000 mPa·s, the viscosity of the liquid resin composition may exceed 100 Pa·s.

It is also desirable to select an epoxy resin having 20 or less of a number n of repeating structures as the epoxy resin having a polyalkylene glycol framework. If the number n of repeating structures is more than 20, the viscosity of the epoxy resin may exceed 1000 mPa·s or the viscosity of the liquid resin composition may exceed 100 Pa·s.

It is desirable that the liquid curing agent has a plurality of phenolic hydroxy groups per molecule, and it is more desirable to use a phenol-type curing agent having an active hydrogen amount of 100 (g/eq) to 200 (g/eq), inclusive. If a phenol-type curing agent having an active hydrogen amount of less than 100 (g/eq) or a phenol-type curing agent having an active hydrogen amount of more than 200 (g/eq) is used, the probability of occurrence of the reaction between the epoxy resin having a polyalkylene glycol framework and the liquid curing agent or the curing reaction may be adversely affected.

It is desirable that the phenol-type curing agent has a viscosity of 1000 mPa·s or less. If the viscosity of the phenol-type curing agent is more than 1000 mPa·s, the viscosity of the liquid resin composition may exceed 100 Pa·s.

The liquid resin composition according to the present exemplary embodiment can be supplied as a raw material for a certain type of prepreg or a resin substrate. In this case, a glass cloth, a non-woven fabric or the like may be impregnated with the liquid resin composition.

It is preferable to add a curing accelerator to the liquid resin composition. The curing accelerator preferably contains an imidazole compound. If the curing accelerator is not added to the liquid resin composition, it is required to heat the liquid resin composition at 150° C. for several hours or longer. In addition, if the curing accelerator is not added to the liquid resin composition, even when the liquid resin composition is cured, a portion having non-uniform curing strength may be easily formed in the cured product and therefore the reliability of the cured product as a wiring structure may be adversely affected. The addition of the curing accelerator to the liquid resin composition makes it possible to keep the shape of a provisionally cured product. As a result, in a case where it is intended to produce a cured product of a liquid resin composition containing a curing accelerator, it becomes possible to provisionally cure the liquid resin composition in a mold, then take a provisionally cured product out of the mold, and then completely cure the provisionally cured product while keeping the shape of the provisionally cured product.

It is preferable that the amount of the ceramic filler with respect to the whole amount of the liquid resin composition or the while amount of the cured product is in a range from 50% to 90% by mass, inclusive. If the amount of the ceramic filler is less than 50% by mass, the cured product may become brittle. Furthermore, the coefficient of thermal expansion (CTE) is increased and therefore, when a wiring structure (or circuit board) produced from the liquid resin composition is made thin, the wiring structure (or circuit board) is likely to warp, and it may be resulted in the increase in difference between the coefficient of thermal expansion of the wiring structure (or circuit board) and that of a semiconductor.

If necessary, it is preferable to add at least one of a urethane resin and a silicone resin to the liquid resin composition in an amount of 0.5% by mass to 40% by mass inclusive with respect to the amount of the liquid epoxy resin composition. The addition of a urethane resin and/or a silicone resin makes it possible to achieve an effect of promoting the reduction in elasticity. If the amount to be added is more than 40% by mass, plasticization may proceed and the adhesiveness of the cured product to a wiring material may be adversely affected. If the amount to be added is less than 0.5% by mass, the effect exerted by the addition may not be achieved.

Hereinafter, the effect of the present exemplary embodiment will be describe in more detail with reference to samples shown in Table 1 and Table 2. Table 1 shows the compounding composition of each sample of liquid resin compositions.

TABLE 1

| | | Sample A | Sample B | Sample C | Sample a | Sample b | Sample c | Sample d | Sample e | Sample f | Sample g | Sample h |
|---|---|---|---|---|---|---|---|---|---|---|---|---|
| Liquid epoxy resin | Bisphenol F-type epoxy resin | 5.50 | 5.50 | 2.75 | 5.50 | 5.50 | 5.50 | 6.75 | 5.50 | 2.00 | 5.50 | 5.50 |
| | Epoxy resin 1 | 2.75 | 2.75 | 5.50 | — | 2.75 | 2.75 | 1.50 | — | 6.25 | 2.75 | 2.75 |
| | Epoxy resin 2 | — | — | — | 2.75 | — | — | — | 2.75 | — | — | — |
| Liquid curing agent | Liquid phenolic resin | 6.00 | 6.00 | 4.80 | — | — | — | 6.50 | 7.50 | 4.50 | 6.00 | 6.00 |
| | Acid anhydride | — | — | — | 9.00 | 7.10 | — | — | — | — | — | — |
| | Aromatic amine | — | — | — | — | — | 2.70 | — | — | — | — | — |

TABLE 1-continued

| | | Sample A | Sample B | Sample C | Sample a | Sample b | Sample c | Sample d | Sample e | Sample f | Sample g | Sample h |
|---|---|---|---|---|---|---|---|---|---|---|---|---|
| Curing accelerator | Imidazole | 0.71 | 0.71 | 1.31 | 0.86 | 0.77 | 0.55 | 0.74 | 0.79 | 1.28 | 0.71 | 0.71 |
| Ceramic filler | Silica | 100 | 27 | 100 | 100 | 100 | 80 | 100 | 100 | 100 | 8 | 200 |
| | Total | 114.96 | 41.96 | 114.36 | 118.11 | 116.12 | 91.50 | 115.49 | 116.54 | 114.03 | 22.96 | 214.96 |

*Epoxy resin 1: an epoxy resin having a polyalkylene glycol framework
Epoxy resin 2: an epoxy resin containing a naphthalene ring As a bisphenol F-type epoxy resin, an epoxy resin (CAS No. 9003-36-5) is used. As epoxy resin 1, an epoxy resin containing a polyalkylene glycol propylene framework (CAS No. 9072-62-2) is used. As epoxy resin 2, an epoxy resin containing a naphthalene ring (CAS No. 27610-48-6) is used. As a liquid phenolic resin, a phenolic resin (CAS No. 27924-97-6) is used. As an acid anhydride, a substance (CAS No. 25550-51-0) is used. As an aromatic amine, an amine (CAS No. 69178-41-2) is used. As a curing accelerator, imidazole (CAS No. 931-36-2) is used. As a ceramic filler, silica (CAS No. 60676-86-0) is used. These substances are by way of example only, and other compounds, materials having other product numbers or materials having other CAS numbers can also be used as long as the compounds and the materials can act as the liquid epoxy resin, the liquid curing agent, the curing accelerator and the ceramic filler, respectively.

Samples A to C are examples of the liquid resin composition according to the present exemplary embodiment. Samples "a" to "h" are examples of the liquid resin composition which are produced for comparison. In samples A to C, as liquid epoxy resins, a bisphenol F-type epoxy resin (a commercially available product) and epoxy resin 1 that is an epoxy resin having a polyalkylene glycol framework (a commercially available product) are used. As a curing agent, a liquid curing agent which is a liquid phenolic resin and has a plurality of phenolic hydroxy groups per molecule is used. An acid anhydride or an aromatic amine is not added. As a curing accelerator, imidazole (a commercially available product) is added. If necessary, a silicone resin (a commercially available product) may be added as an elasticity-reducing material to each of the samples. As a ceramic filler, silica which is a commercially available product is used. Alternatively, any other type of ceramic filler may be used.

In Table 1, the content of the ceramic filler (filler content) in the liquid resin composition is as follows: about 85 wt % in samples A, C; and about 60 wt % in sample B. A relationship between the viscosity of each of samples A to C and the content of the ceramic filler is as shown in FIG. 1, and there is a tendency that the viscosity increases with the increase in the filler content. FIG. 1 shows results of experiments carried based on samples A to sample C in which the content of the ceramic filler ranges from 30 wt % to 90 wt % in the liquid resin composition, and results of other samples which are not shown in Table 1 are also shown in the figure. That is, the viscosities of samples A to C is in the range from 30 to 100 Pa·s.

In contrast to samples A to C as described above, in samples "a" and "b", an acid anhydride is used in place of a liquid phenolic resin as the liquid curing agent. In sample "c", an aromatic amine is used in place of a liquid phenolic resin as the liquid curing agent. In sample "d", the content of the epoxy resin having a polyalkylene glycol framework in the liquid epoxy resin is as small as less than 30% by mass. In sample "e", the liquid epoxy resin is composed only of a bisphenol F-type epoxy resin. Therefore, as mentioned below, a cured product of sample "e" has a Tg higher than 120° C. In sample "f", on the contrary, the content of epoxy resin 1 in the liquid epoxy resin is large and the amount of the added curing accelerator is also large. Therefore, as mentioned below, the cured product of sample "1" has a Tg lower than 50° C. In sample "g", the content of the ceramic filler is less than 30% by mass. In sample "h", on the contrary, the ceramic filler is blended at a content more than 90% by mass.

In samples "a" and "e", epoxy resin 2 which is an epoxy resin containing a naphthalene ring is used in place of the epoxy resin having a polyalkylene glycol framework. That is, as the liquid epoxy resin, a mixture of a bisphenol F-type epoxy resin and epoxy resin 2 is used.

The results of the evaluation on properties of cured products of liquid resin composition samples shown in Table 1 are shown in Table 2.

TABLE 2

| | Sample A | Sample B | Sample C | Sample a | Sample b | Sample c | Sample d | Sample e | Sample f | Sample g | Sample h |
|---|---|---|---|---|---|---|---|---|---|---|---|
| Glass transition temperature (° C.) | 102 | 98 | 61 | 149 | 105 | 83 | 114 | 135 | 23 | 101 | 107 |
| CTE1(ppm/K) | 11 | 28 | 12 | 11 | 12 | 12 | 11 | 12 | 11 | 38 | 9 |
| Elastic modulus (MPa) | 14 | 9 | 14 | 19 | 18 | 17 | 18 | 18 | 0.5 | 8 | 21 |
| Shore D hardness | 51 | 48 | 46 | 78 | 71 | 65 | 62 | 68 | <40 | <40 | <40 |
| Warpage (mm) | 8 | 15 | 7 | 70 | 41 | 49 | 46 | 53 | 8 | 22 | 8 |
| Cracking | none | none | none | observed | observed | observed | observed | observed | none | none | observed |
| Delamination | none | none | none | observed | observed | none | none | none | observed | none | none |

The glass transition temperature (Tg, unit: ° C.) is measured by DSC (differential scanning calorimetry), but may also be measured by TMA (thermal mechanical analysis) or DTA (differential thermal analysis). The unit of the coefficient of thermal expansion (CTE1) is ppm/K.

The elastic modulus (unit: MPa) is determined by a three-point bending test using an evaluation sample produced by curing the liquid resin composition into a plate-like form. For the measurement of an elastic modulus of a resin cured product, it is practical to measure a bending elastic modulus. Even if it is attempted to employ a common tensile test, it may be difficult to process a gripping part of a resin test piece and it may also be difficult to clarify the conditions or definition of the measurement.

In the evaluation of warpage, cracking, and delamination, an evaluation sample produced by forming a cured product on one surface of a resin substrate is used. An amount of warpage is determined in a manner as follows. A height of one edge of the evaluation sample is measured as an amount of warpage (unit: mm) while pressing the other edge of the evaluation sample against a horizontal surface. With respect to cracking or delamination, the evaluation is made by placing a thumb and a middle finger on one surface of the evaluation sample and placing the back of an index finger on a rear surface of the evaluation sample to bend the evaluation sample around the index finger, and then visually observing the evaluation sample. Alternatively, the evaluation may also be made by bending the evaluation sample along the whole circumference of a side surface of a circular cylindrical plastic container having a diameter of 40 mm and then visually observing the evaluation sample. The details with the evaluation are mentioned below.

As shown in Table 2, in sample A, the Tg is 102° C., the CTE is 11 ppm/K, the elastic modulus is 14 MPa, the Shore D hardness is 51, and the amount of warpage is 8 mm. In sample A, when the bending test or the like is carried out, none of cracking or delamination is observed. In sample B, the Tg is 98° C., the CTE is 28 ppm/K, the elastic modulus is 9 MPa, the Shore D hardness is 48, and the amount of warpage is 15 mm. In this sample, none of cracking or delamination is observed. In sample C, the Tg is 61° C., the CTE is 12 ppm/K, the elastic modulus is 14 MPa, the Shore D hardness is 46, and the amount of warpage is 7 mm. In this sample, none of cracking or delamination is observed.

In sample "a", on the contrary, an acid anhydride is used as the liquid curing agent. Therefore, the Tg is 149° C. that is too high. As a result, the Shore D hardness is 78 that is too hard, and both cracking and delamination are observed. In this sample, the amount of warpage is 70 mm that is too large. Therefore, this sample is not suitable for use in a wiring structure (or a circuit board having flexibility).

Likewise, in sample "b", an acid anhydride is used as the liquid curing agent. Therefore, the Tg is 105° C. that is too high. As a result, both cracking and delamination are observed. The amount of warpage is as large as 41 mm.

In sample "c", an aromatic amine is used as the liquid curing agent. As a result, although the Tg is 83° C., the amount of warpage is as large as 49 mm, and cracking is observed.

In sample "d", the amount of epoxy resin 1 added is too small. As a result, the amount of warpage is as large as 46 mm and cracking is observed. In sample "e", the Tg is as high as 135° C. As a result, the amount of warpage is as large as 53 mm and cracking is observed.

In sample "f", the Tg is as low as 23° C. As a result, the amount of warpage is as small as 8 mm and cracking is not observed. However, the Shore D hardness and the elastic modulus are excessively small, and therefore a problem arises where a strength level needed to mount a semiconductor may not be obtained.

In sample "g", the amount of the ceramic filler added is reduced to 8. As a result, the coefficient of thermal expansion (CTE1) is as large as 38 ppm/K. In this case, reliability of a wiring substrate (or a circuit board) in which a semiconductor is to be mounted or a package produced by mounting a semiconductor to the wiring structure (or a circuit board having flexibility) might be insufficient. In sample "h", on the contrary, the amount of the ceramic filler added is increased to 200. As a result, the coefficient of thermal expansion is small. However, the cured product is brittle and cracking is observed. In the evaluations in this time, although delamination is not observed, it is considered that the possibility of the occurrence of delamination is high.

As mentioned above, the liquid resin composition according to the present exemplary embodiment contains a liquid epoxy resin including a first epoxy resin having a polyalkylene glycol framework; a liquid curing agent having a plurality of phenolic hydroxy groups per molecule; a curing accelerator; and a ceramic filler. The first epoxy resin is included in the liquid epoxy resin at a content in the range from 30% to 70% by mass, inclusive. The ceramic filler has an average particle diameter of 50 μm or less. The ceramic filler is contained in the liquid resin composition at a content in the range from 50% to 90% by mass, inclusive. The liquid resin composition has a viscosity of 100 Pa·s or less at 25° C. Using the liquid resin composition allows cracking or delamination to be prevented, as shown in Table 2.

Next, a wiring structure produced using the cured product of the above-mentioned liquid resin composition will be described. The wiring structure has flexibility at a level that cannot be achieved by conventional glass epoxy boards and also has mountability at a level that cannot be achieved by conventional flexible substrates produced using polyimide films and the like. The term "flexibility" as used herein refers to a property of being hardly broken even upon bending, and the term "mountability" as used herein refers to stiffness or rigidity at such a level that a component can be mounted without requiring the use of a holding plate or the like. An interposer and a circuit board having flexibility, which are kinds of the wiring structure, will also be described.

Figure 9A:
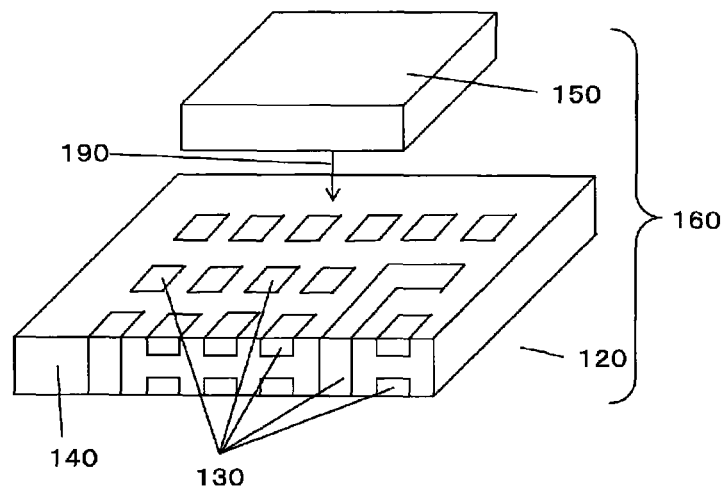
FIG. 9A is a perspective view illustrating one example of a wiring structure (a coreless interposer) produced using the cured product of the liquid resin composition according to the exemplary embodiment of the present invention.

FIG. 9A is a perspective view illustrating one example of wiring structure 120 produced using the cured product of the liquid resin composition according to the present exemplary embodiment.

Wiring structure 120 includes cured product 140 and metallic wiring 130. Cured product 140 is a cured product of the above-mentioned liquid resin composition according to the present exemplary embodiment. Metallic wiring 130 partially adheres to cured product 140. Alternatively, metallic wiring 130 may be partially embedded in cured product 140. Cured product 140 has a Tg of 50° C. to 120° C., inclusive, and an elastic modulus of 20 GPa or less at 25° C. Package 160 includes wiring structure 120 and semiconductor 150. Semiconductor 150 is mounted to wiring structure 120 so as to be electrically connected to metallic wiring 130.

Metallic wiring 130 is formed by patterning a copper plate or a copper foil two-dimensionally or three-dimensionally. Metallic wiring 130 can be formed using at least one sheet of copper plate having a thickness of 0.1 mm or more or at least one sheet of copper foil having a thickness of less than 0.1 mm. As metallic wiring 130, tough-pitch copper, or a rolled copper plate or a rolled copper foil may also be used. In this case, the bending reliability of metallic wiring 130 is increased. As shown in FIG. 9A, wiring structure 120 includes metallic wiring 130 and cured product 140 that is formed by curing the liquid resin composition filled in two-dimensional or three-dimensional void spaces in metallic wiring 130.

In an upper surface or a lower surface of wiring structure 120, metallic wiring 130 is partially exposed. Semiconductor 150 or other components can be mounted on the exposed parts. The surface (exposed surface) of metallic wiring 130 and a surface of cured product 140 are arranged so as to share a common single surface, so that unevenness cannot be formed between the above-mentioned surfaces. In this manner, semiconductor 150 can be mounted easily to wiring structure 120. A difference in level between the two surfaces is preferably ±0.10 mm or less, more preferably ±0.05 mm or less. A thickness of wiring structure 120 is preferably 2 mm or less, more preferably 1 mm or less, still more preferably 0.5 mm or less, so that wiring structure 120 can contribute to a reduction in thickness of a resultant device. An outer shape of wiring structure 120 may have a size of 5 mm or more square, 10 mm or more square, or 100 mm or more square. Since wiring structure 120 is hardly broken even when thinned, and a difference in a coefficient of thermal expansion between wiring structure 120 and a semiconductor chip is small, wiring structure 120 can be used as a thin wiring structure (or a circuit board having flexibility) such as an interposer.

That is, wiring structure 120 shown in FIG. 9A may be configured as an interposer. A thickness of the interposer is as thin as 0.2 mm or less, 0.1 mm or less, or 50 µm or less. In this case, a pitch pattern distance of the metallic wiring may be as small as 100 µm or less, 50 µm or less, or 30 µm or less. Wiring structure 120 includes cured product 140 and metallic wiring 130. The interposer that is wiring structure 120 can exhibit excellent flexibility when a Tg of cured product 140 is adjusted to a temperature in a range from 50° C. to 120° C., inclusive, and an elastic modulus of cured product 140 at 25° C. is adjusted to 20 GPa or less. Therefore, the interposer hardly undergoes warpage during mounting. Package 160 produced by mounting semiconductor 150 to metallic wiring 130 embedded in the interposer can be formed thin. Package 160 does not have a core substrate part that is a conventional glass epoxy resin board or a build-up-type wiring board. In other words, package 160 has a coreless mounted structure. Therefore, package 160 can be made smaller and thinner. In an interposer that is wiring structure 120 shown in FIG. 9A or package 160 in which wiring structure 120 is used as an interposer, it is advantageous to adjust the Tg of the cured product to a temperature in a range from 50° C. to 120° C., inclusive. Furthermore, the reliability of the interposer and the reliability of package 160 in which the interposer is used can be enhanced by adjusting the elastic modulus of the cured product at 25° C. to 20 GPa or less.

A module may be produced by using, in place of wiring structure 120, a conventional interposer having semiconductor 150 or the like mounted therein, and by coating semiconductor 150 or the like with the liquid resin composition according to the present invention to seal semiconductor 150 or the like with cured product 140 of the liquid resin composition.

Figure 9B:
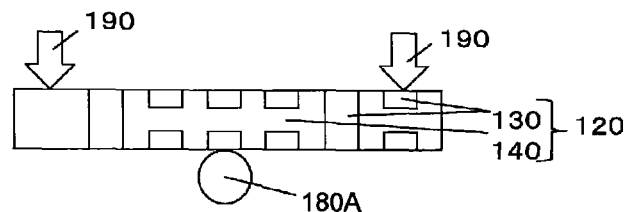
FIG. 9B is a side view illustrating a method for evaluating an elastic modulus of the wiring structure shown in FIG. 9A.
Figure 9C:
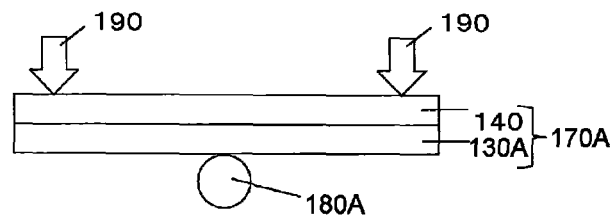
FIG. 9C is a side view illustrating a method for evaluating an elastic modulus of an evaluation sample in place of the wiring structure shown in FIG. 9B.

Next, a method for measuring an elastic modulus of wiring structure 120 by a three-point support method and a bending test on wiring structure 120 will be described with reference to FIGS. 9B and 9C. FIG. 9B is a side view illustrating a method for evaluating the elastic modulus of wiring structure 120, and FIG. 9C is a side view illustrating a method for evaluating an elastic modulus of evaluation sample 170A in place of wiring structure 120. In evaluation sample 170A, metallic plate 130A is used in place of metallic wiring 130 and cured product 140 is formed on one surface of metallic plate 130A.

As shown in FIGS. 9B and 9C, jig 180A is set at a center part of wiring structure 120 or evaluation sample 170A and then a pressure is applied onto both edges of wiring structure 120 or evaluation sample 170A in a direction shown by arrow 190. In this manner, the elastic modulus of wiring structure 120 or evaluation sample 170A can be measured. As jig 180A, a metallic bar, a drill teeth or the like each of which is commercially available and has a diameter of 1 mm to 20 mm may be used. As jig 180A having a diameter of 30 mm or more, a commercially available polyethylene pipe or a commercially available polyethylene bottle with a lid may also be used. When a plate-shaped sample formed from only cured product 140 is used in place of wiring structure 120, it is possible to measure an elastic modulus of cured product 140 itself by a three-point support method.

When wiring structure 120 having an actual wiring pattern is subjected to a test, there may be cases where test results are affected by a pattern density of metallic wiring 130, an amount of copper remaining in the sample and the like. In this case, it is preferable to use evaluation sample 170A for the test. The use of evaluation sample 170A makes it possible to perform an evaluation under conditions where an influence of the pattern density of metallic wiring 130, the amount of copper remaining in the sample and the like are reduced. For example, cured product 140 is formed at a thickness of 1 mm on one surface of metallic plate 130A of copper or aluminum. In measurement of an elastic modulus or the like using evaluation sample 170A, a resin substrate (e.g., a cured product of a prepreg such as FR4) may be used in place of metallic wiring 130 or metallic plate 130A.

In FIG. 9C, a thickness of cured product 140 may be adjusted to 1 mm and a copper plate or an aluminum plate may be used as metallic plate 130A. In this case, stiffness upon bending, adhesion, presence or absence of cracking and the like can be tested.

Next, a method for evaluating an evaluation sample that is produced by curing the above-mentioned liquid resin composition on a resin substrate will be described with reference to FIGS. 10A to 14B.

Figure 10A:
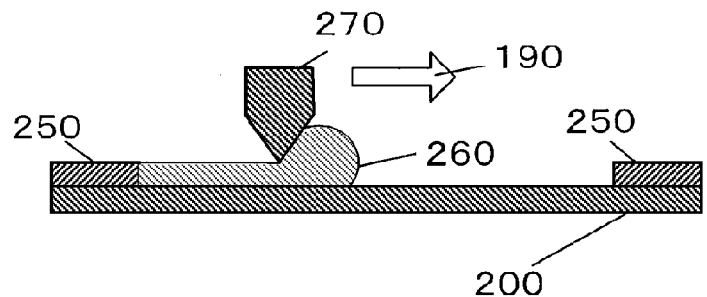
FIG. 10A illustrates a way of producing an evaluation sample by forming the cured product of the liquid resin composition according to the exemplary embodiment of the present invention on a resin substrate.

FIG. 10A is a cross-sectional view illustrating formation of cured product 140 of the liquid resin composition on resin substrate 200. Squeegee 270 is moved in a direction shown by arrow 190 while surrounding a periphery of resin substrate 200 made from FR4 or the like with metallic mask 250. In this manner, liquid resin composition 260 is molded into a desired shape. In this regard, it is also preferable to perform a vacuum defoaming procedure in combination with the molding procedure.

Figure 10B:
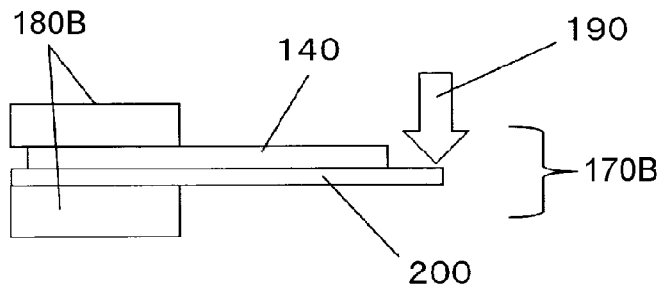
FIG. 10B illustrates a method for evaluating the sample produced by the method shown in FIG. 10A.
Figure 10C:
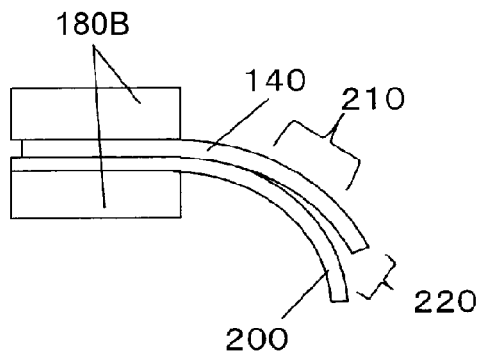
FIG. 10C illustrates a state of the measurement sample shown in FIG. 10B during the evaluation.
Figure 10D:
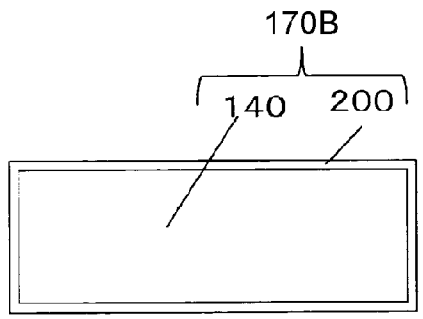
FIG. 10D is a top view of the measurement sample shown in FIG. 10B.
Figure 10E:
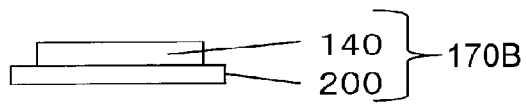
FIG. 10E is a side view of the measurement sample shown in FIG. 10B.

FIGS. 10B and 10C are side views illustrating a bending test, which is an evaluation method, using evaluation sample 170B. FIGS. 10D and 10E are a top view and a side view of evaluation sample 170B, respectively.

Evaluation sample 170B includes resin substrate 200 and cured product 140 that is formed using metallic mask 250 on an area of one surface of resin substrate 200 except for an outer peripheral part of resin substrate 200. Resin substrate 200 is, for example a glass epoxy resin cured product such as FR4.

In FIG. 10B, a size of resin substrate 200 is, for example, 170 mm×50 mm×0.3 mm (thickness), and cured product 140 is formed into a sheet shape having a size of 129 mm×42 mm×0.8 mm (thickness). Evaluation sample 170B formed as above is fixed at an end with jig 180B. An external force is applied to a portion of the other end of evaluation sample 170B in a direction shown by arrow 190. The other end is not fixed with jig 180B and resin substrate 200 is exposed there.

FIG. 10C illustrates a state of evaluation sample 170B after the bending test. In some samples, delaminated part 210 is formed so as to have gap 220 between resin substrate 200 and cured product 140. For preventing the formation of gap 220 or delaminated part 210, the epoxy resin having a polyalkylene glycol framework should be included at a content in the range of 30% to 70% by mass, inclusive, with respect to the total amount of the epoxy resins.

Figure 11A:
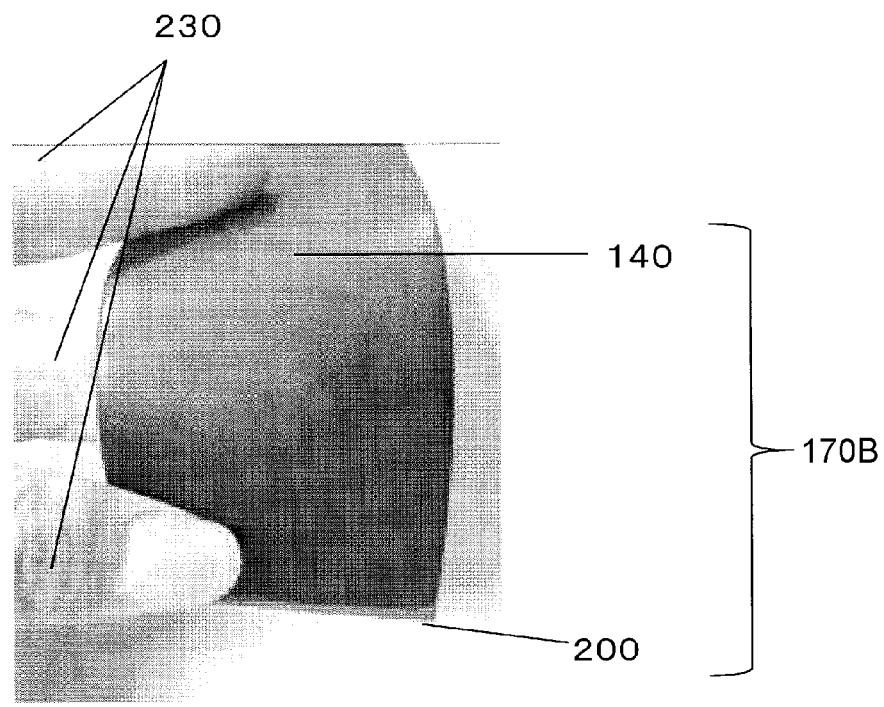
FIG. 11A shows a photograph of sample A in which the cured product of the liquid resin composition according to the exemplary embodiment of the present invention is formed on the resin substrate.
Figure 11B:
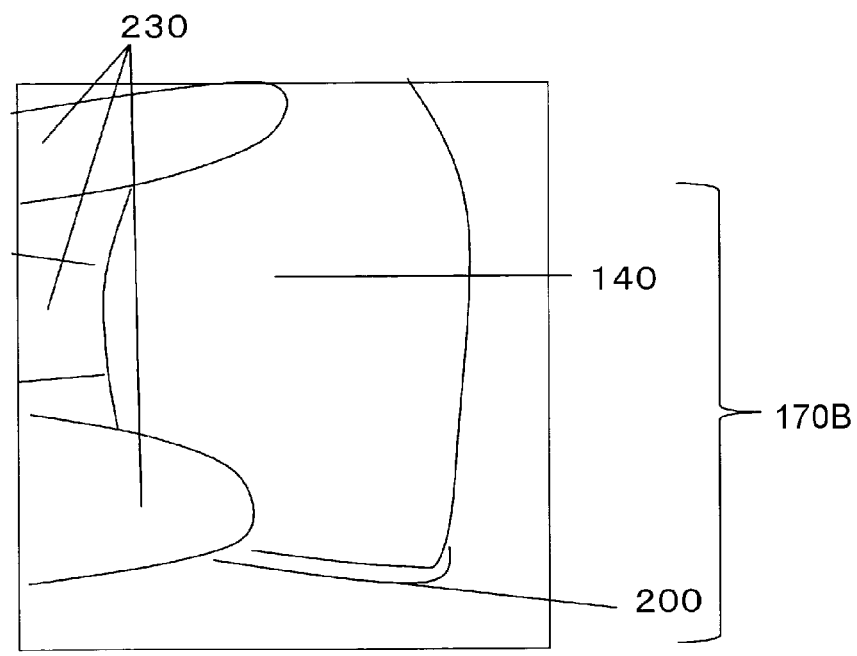
FIG. 11B is a schematic illustration of the photograph shown in FIG. 11A.

FIG. 11A shows a photograph of evaluation sample 170B produced using sample A described above and whether or not cracking or delamination is generated is evaluated, and FIG. 11B is a schematic illustration thereof.

In cured product 140 formed on resin substrate 200, cracking is not generated when the evaluation sample is bent with fingers 230. In sample A, gap 220 or delaminated part 210 is not generated in the bending test shown in FIG. 9A. This is because the content of the epoxy resin having a polyalkylene glycol framework is in the range from 25% to 75% by mass, inclusive, with respect to the total amount of the epoxy resins and cured product 140 has a Tg of 120° C. or less and an elastic modulus of 20 GPa or less.

Figure 12A:
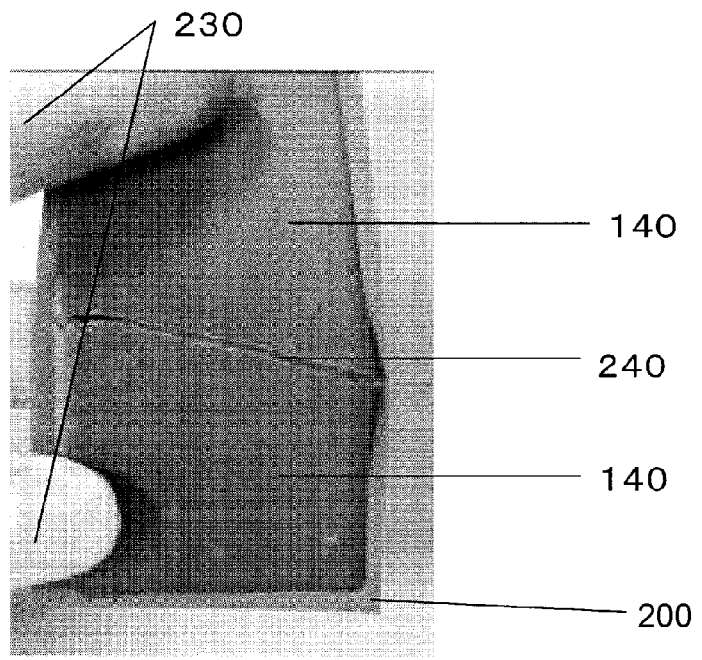
FIG. 12A shows a photograph of sample "a" in which a cured product of a liquid resin composition different from that of the exemplary embodiment of the present invention is formed on a resin substrate.
Figure 12B:
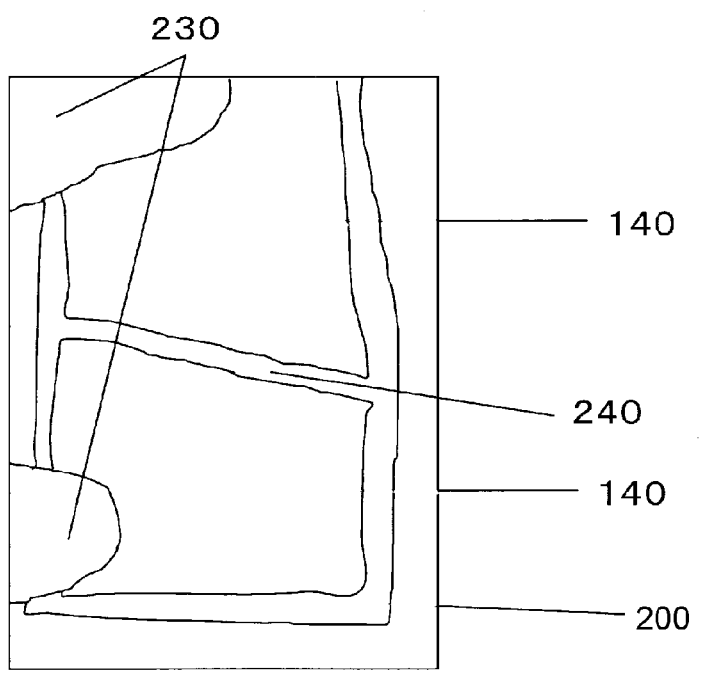
FIG. 12B is a schematic illustration of the photograph shown in FIG. 12A.

FIG. 12A shows a photograph of evaluation sample 170B produced using sample "a" described above and whether or not cracking or delamination is generated is evaluated, and FIG. 12B is a schematic illustration thereof.

In the case of sample "a", when the sample is bent with fingers 230, a piece of crack 240 is formed. In a vicinity of crack 240 formed on sample "a", delaminated part 210 and gap 220 are also formed, but these are not shown in the figures. It is considered that this is partly because any epoxy resin having a polyalkylene glycol framework is not contained in the liquid epoxy resin but an epoxy resin containing a naphthalene ring is contained. Meanwhile, when the content of the epoxy resin having a polyalkylene glycol framework is 30% by mass or less with respect to the total amount of the epoxy resins, it is confirmed that the Tg becomes as high as 149° C. and the problem shown in FIGS. 12A and 12B may occur.

Figure 13A:
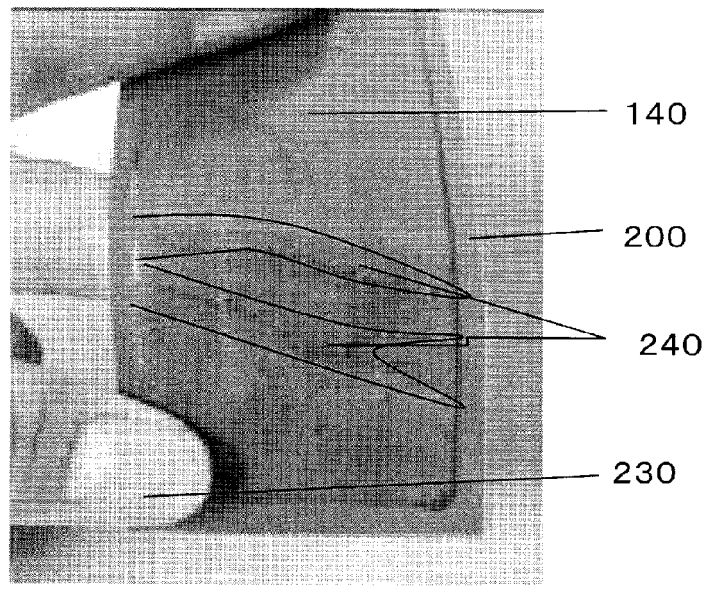
FIG. 13A shows a photograph of sample "b" in which a cured product of a liquid resin composition different from that of the exemplary embodiment of the present invention is formed on a resin substrate.
Figure 13B:
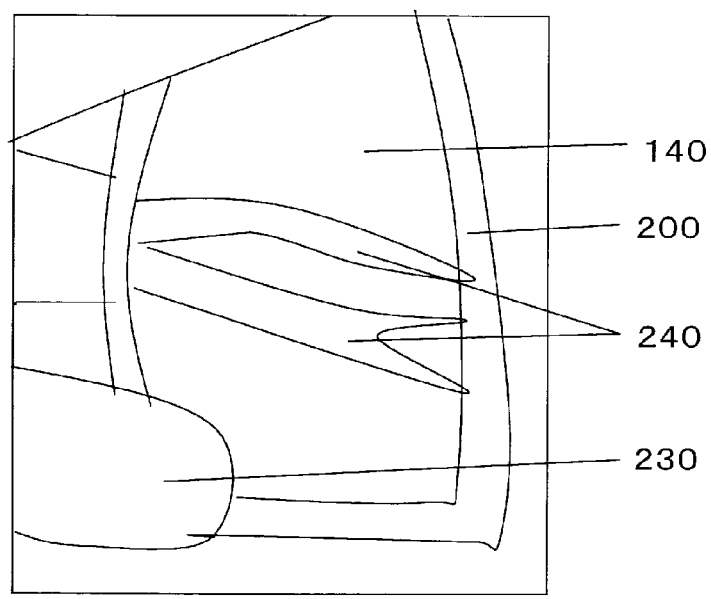
FIG. 13B is a schematic illustration of the photograph shown in FIG. 13A.

FIG. 13A shows a photograph of evaluation sample 170B produced using sample "b" described above and whether cracking or delamination is generated is evaluated, and FIG. 13B is a schematic illustration thereof.

In the case of sample "b", when the sample is bent with fingers 230, a plurality of piece of cracks 240 is formed. In a vicinity of cracks 240 formed on sample "b", delaminated part 210 and gap 220 are also formed, but these are not shown in the figures. It is considered that this is partly because an acid anhydride is used as the liquid curing agent.

Figure 14A:
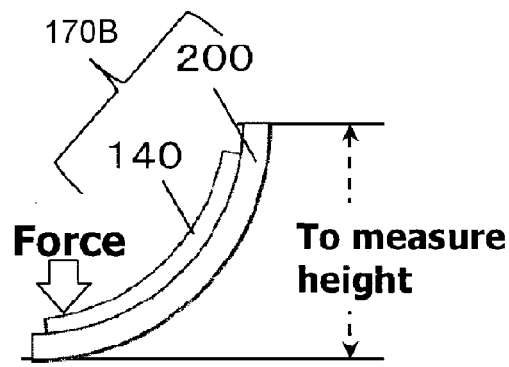
FIG. 14A illustrates a method for testing the evaluation sample produced by the method shown in FIG. 10A.

FIG. 14A is a side view illustrating a warpage test. The warpage test is carried out in the following manner: a height of one end of evaluation sample 170B is measured in terms of an amount of warpage (unit: mm) while pressing the other edge of evaluation sample 170B against a horizontal surface in a direction shown by arrow 190.

Figure 14B:
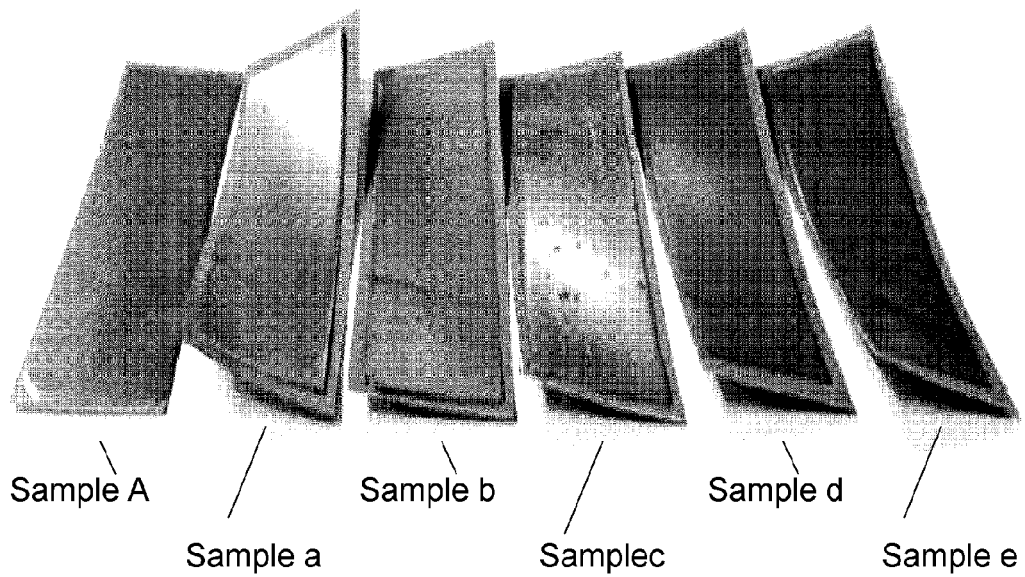
FIG. 14B shows photographs of sample A in which the cured product of the liquid resin composition according to the exemplary embodiment of the present invention is formed on the resin substrate, and samples "a" to "e" each in which a cured product of a liquid resin composition different from that of the exemplary embodiment of the present invention is formed on a resin substrate.

FIG. 14B shows a photograph illustrating the degree of generated warpage in each of samples (sample A, samples "a" to "e") shown in Table 2. In sample A, almost no warpage is generated; while in samples "a" to "e", a great amount of warpage is generated. As mentioned above, in the evaluation sample of sample A, none of cracking or delamination is not generated; while in evaluation samples of samples "a" to "e", both a great amount of warpage as illustrated in the photograph and cracking or delamination occur.

As mentioned above, the evaluation sample of sample A according to the present exemplary embodiment is satisfactory with respect to hardness, warpage, cracking and delamination. On the other hand, the evaluation samples of samples "a" to "e" are unsatisfactory with respect to any one of hardness, warpage, cracking and delamination depending on the compounding compositions of the samples.

As described above, evaluating warpage, flexibility and stiffness of cured product 140 of liquid resin composition 260 using resin substrate 200 allows liquid resin composition 260 to be optimized, depending on a shape or an intended use of wiring structure 120. When liquid resin compositions of samples A to C are used for producing wiring structures 120, warpage does not occur in wiring structures 120 and therefore semiconductor 150 can be mounted in each of wiring structures 120 at a high density.

Figure 15A:
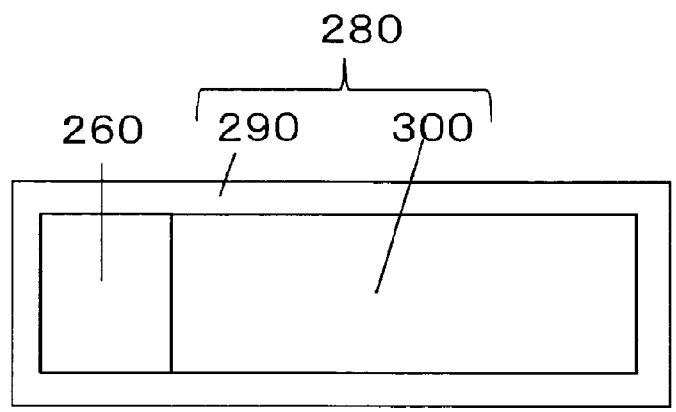
FIG. 15A illustrates a way of producing an evaluation sample by forming the cured product of the liquid resin composition according to the exemplary embodiment of the present invention on a metallic plate.
Figure 15B:
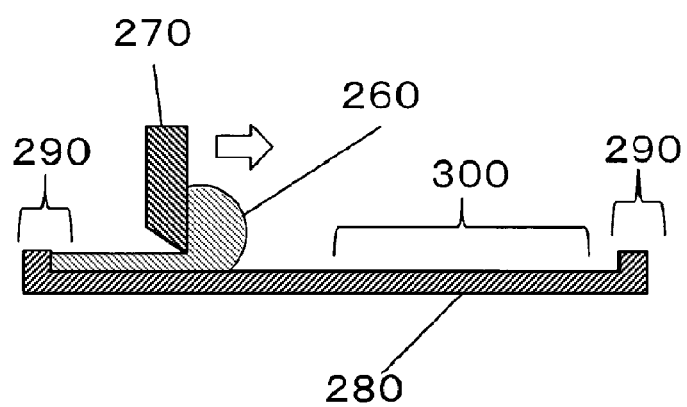
FIG. 15B is a cross-sectional view of FIG. 15A.
Figure 15C:
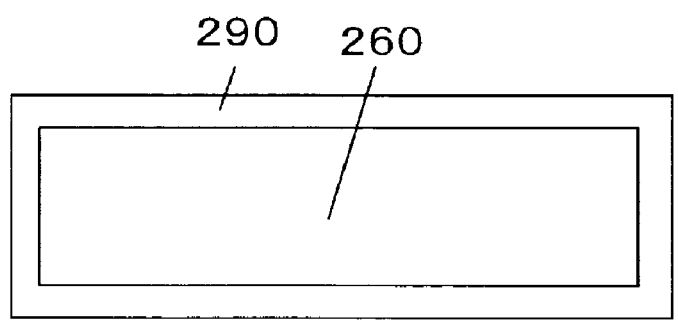
FIG. 15C is a top view of an evaluation sample produced by the method shown in FIG. 15A before curing.
Figure 15D:
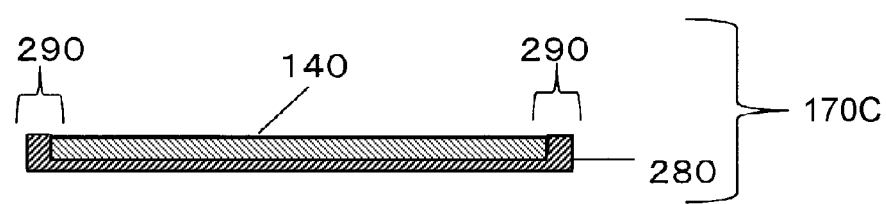
FIG. 15D is a cross-sectional view of a cured form of the evaluation sample shown in FIG. 15C.

Next, one example of evaluation results obtained in cases where liquid resin composition 260 is cured on metallic plate 280 will be described with reference to FIGS. 15A to 17B. FIG. 15A illustrates a way of producing an evaluation sample by forming a cured product of liquid resin composition 260 on metallic plate 280, and FIG. 15B is a cross-sectional view of FIG. 15A. FIG. 15C is a top view of an uncured form of evaluation sample 170C produced by the method illustrated in FIG. 15A, and FIG. 15D is a cross-sectional view of a cured form of the evaluation sample illustrated in FIG. 15C.

For example, it is possible to form protruded part 290 and recessed part 300 on metallic plate 280. It is also possible to pour liquid resin composition 260 into recessed part 300 by utilizing protruded part 290 to form evaluation sample 170C.

Protruded part 290 may be formed in a form of a specific type of wiring pattern in the inside of metallic plate 280 as well as an outer periphery of metallic plate 280. Alternatively, recessed part 300 may be formed into a form of a terraced part having such a complicated shape or such a height that recessed part 300 can insulate between wiring patterns. For example, protruded part 290 is formed as a wiring pattern, liquid resin composition 260 is poured into recessed part 300 formed between the wiring patterns and then cured, and then metallic plate 280 that constitutes the bottom of recessed part 300 is removed by a processing technique such as damascening or cutting. In this manner, a wiring structure or a circuit board having flexibility can also be formed.

Figure 16A:
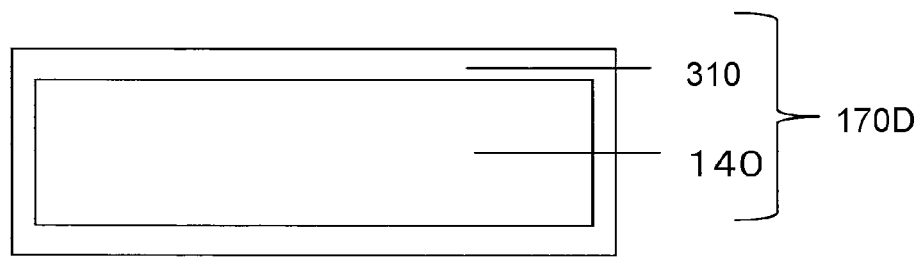
FIG. 16A is a top view of the evaluation sample produced by forming the cured product of the liquid resin composition according to the exemplary embodiment of the present invention on a metallic plate.
Figure 16B:
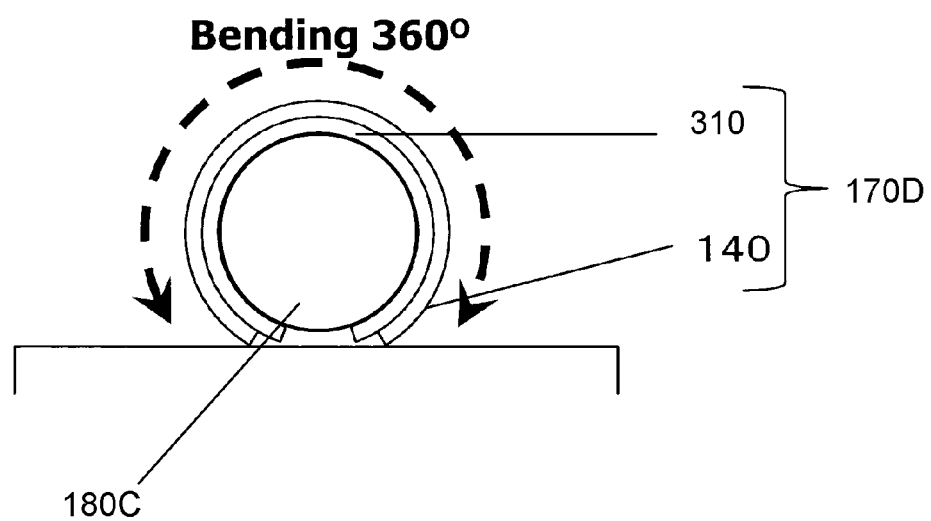
FIG. 16B illustrates a method for evaluating the evaluation sample shown in FIG. 16A.

FIG. 16A is a top view of evaluation sample 170D produced by forming cured product 140 on one surface of metallic plate 310. FIG. 16B is a side view illustrating a way of carrying out a 360-degree bending test on evaluation sample 170D. In the 360-degree bending test, a circular cylindrical plastic container having a diameter of 40 mm is used as jig 180C. As shown in FIG. 16B, cracking and the like can be checked by bending evaluation sample 170D at an angle of 360 degrees along the whole circumference of jig 180C.

Figure 17A:
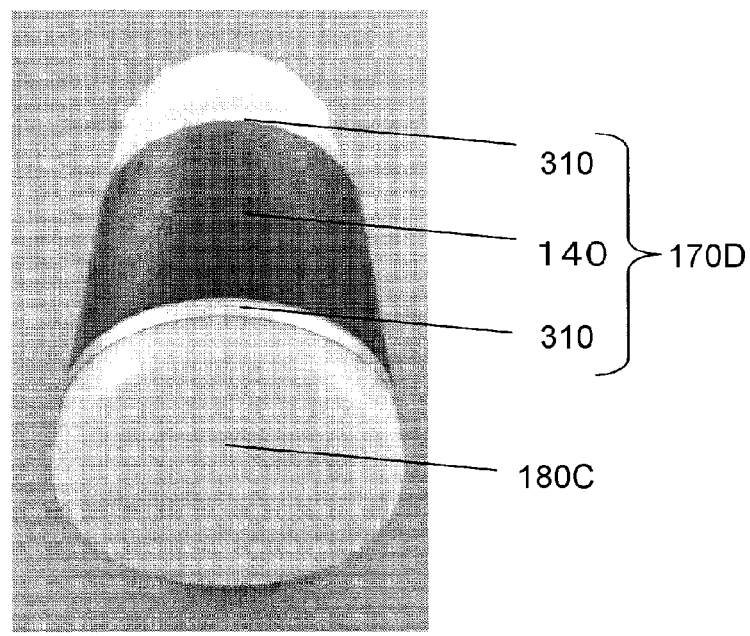
FIG. 17A shows a photograph of sample A.
Figure 17B:
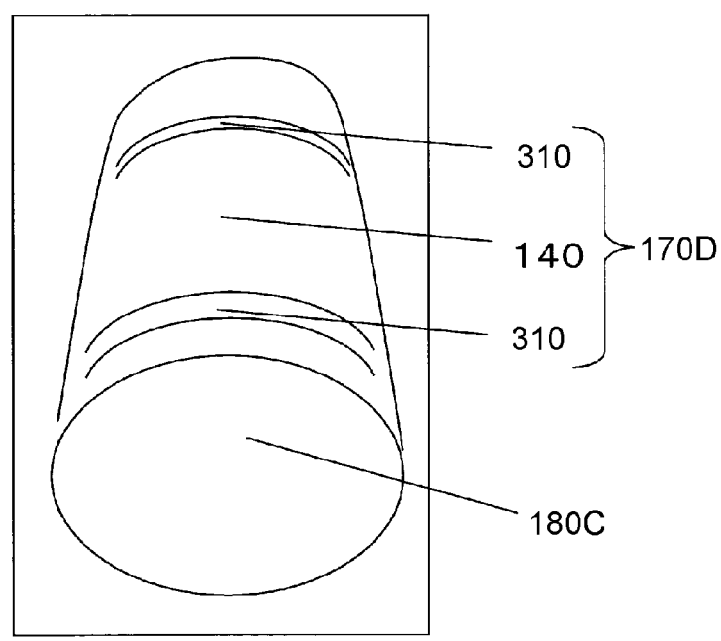
FIG. 17B is a schematic illustration of FIG. 17A.
Figure 18:
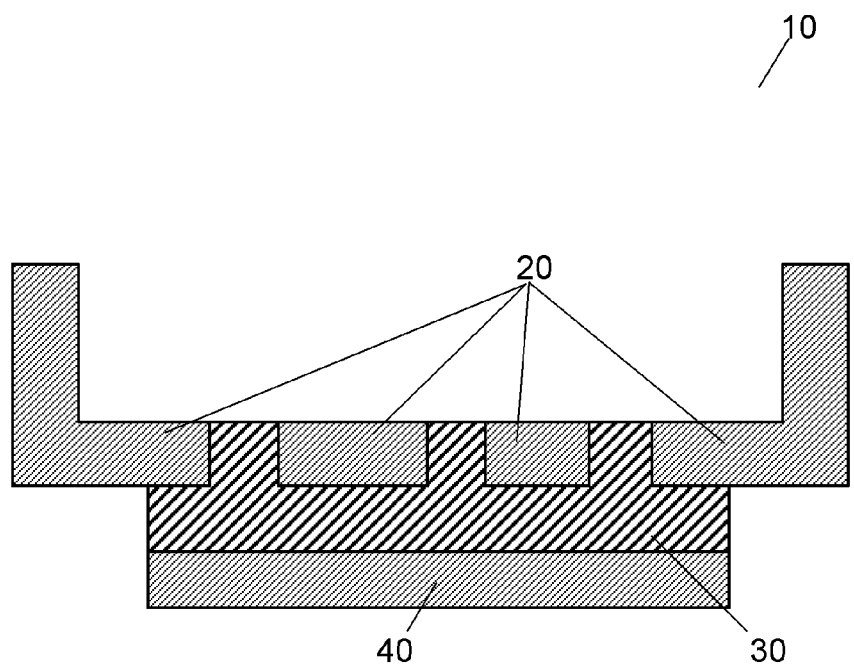
FIG. 18 is a cross-sectional view of a conventional circuit board produced by embedding a lead frame or the like in a resin.

FIG. 17A shows a photograph of evaluation sample 170D, which is produced using liquid resin composition 260 of sample A shown in Table 1, after being subjected to the 360-degree bending test, and FIG. 17B is a schematic illustration thereof. When sample A is used, cracking is not generated. In samples B, C and others, cracking, or delaminated part 210 or gap 220 as illustrated in FIG. 10C is not generated. When samples "a" to "h" are used, on the contrary, cracking and delaminated part 210 are generated (not shown).

INDUSTRIAL APPLICABILITY

The use of the liquid resin composition, the cured product, the wiring structure and the package including the wiring structure according to the present invention makes it possible to reduce the amount of warpage in a package to which a semiconductor or the like is mounted and to enhance the performance of the package.

The invention claimed is:

1. A liquid resin composition comprising:
a liquid epoxy resin containing a first epoxy resin having a polyalkylene glycol framework and a second epoxy resin that is a bisphenol-type epoxy resin;
a liquid curing agent having a plurality of phenolic hydroxy groups per molecule, and a viscosity of 1000 m Pa·s or less;
a curing accelerator; and
a ceramic filler,
wherein the first epoxy resin is contained in the liquid epoxy resin at a content in a range from 30% to 70% by mass, inclusive,
the ceramic filler has an average particle diameter of 50 μm or less and is contained in the liquid resin composition at a content in a range from 50% to 90% by mass, inclusive,
the liquid resin composition has a viscosity of 100 Pa·s or less at 25° C., and is free from both of an acid anhydride and an aromatic amine, and
a cured product of the liquid resin composition has a coefficient of thermal expansion of 7 ppm/K or greater and less than 15 ppm/K.

2. The liquid resin composition according to claim 1, further comprising a viscosity modifier that is at least one of an epoxy-type diluent and an organic solvent.

3. The liquid resin composition according to claim 2, wherein the viscosity modifier is contained in the liquid resin composition at a content of more than 0% by mass and at most 10% by mass.

4. The liquid resin composition according to claim 1, wherein the first epoxy resin has a molecular weight in a range from 500 to 1,000, inclusive.

5. The liquid resin composition according to claim 1, wherein the curing accelerator contains an imidazole compound.

6. The liquid resin composition according to claim 1 further comprising at least one of urethane resin and silicone resin at a content in a range from 0.5% to 40% by mass, inclusive.

7. A cured product of the liquid resin composition according to claim 1, the cured product having a glass transition temperature in a range from 50° C. to 120° C., inclusive, and an elastic modulus of 20 GPa or less at 25° C.

8. The cured product according to claim 7, wherein the cured product has a Shore D hardness of 40 or more at 25° C.

9. A cured product of the liquid resin composition according to claim 1, the cured product having a glass transition temperature in a range from 50° C. to 120° C., inclusive, and a Shore D hardness of 40 or more at 25° C.

10. A wiring structure comprising:
a cured product of the liquid resin composition according to claim 1; and
a metallic wiring that partially adheres to the cured product or is partially embedded in the cured product,
wherein the cured product has a glass transition temperature in a range from 50° C. to 120° C., inclusive, and an elastic modulus of 20 GPa or less at 25° C., and
the wiring structure is a coreless interposer having a thickness less than 0.2 mm.

11. A package comprising:
a wiring structure which is a coreless interposer having a thickness less than 0.2 mm, comprising:
a cured product of the liquid resin composition according to claim 1; and
a metallic wiring that partially adheres to the cured product or is partially embedded in the cured product; and
a semiconductor mounted to the wiring structure,
wherein the cured product has a glass transition temperature in a range from 50° C. to 120° C., inclusive, and an elastic modulus of 20 GPa or less at 25° C.

* * * * *